United States Patent
Hung et al.

(10) Patent No.: US 9,691,874 B2
(45) Date of Patent: Jun. 27, 2017

(54) MANUFACTURING METHOD OF SEMICONDUCTOR STRUCTURE

(71) Applicant: MACRONIX INTERNATIONAL CO., LTD., Hsinchu (TW)

(72) Inventors: Chih-Ling Hung, Kaohsiung (TW); Chien-Wen Chu, Yangmei Township, Taoyuan County (TW); Hsin-Liang Chen, Taipei (TW); Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 94 days.

(21) Appl. No.: 14/641,502

(22) Filed: Mar. 9, 2015

(65) Prior Publication Data
US 2015/0179754 A1 Jun. 25, 2015

Related U.S. Application Data

(62) Division of application No. 13/450,888, filed on Apr. 19, 2012, now Pat. No. 9,029,952.

(51) Int. Cl.
| | |
|---|---|
| *H01L 29/66* | (2006.01) |
| *H01L 29/735* | (2006.01) |
| *H01L 29/08* | (2006.01) |
| *H01L 29/10* | (2006.01) |
| *H01L 29/40* | (2006.01) |

(52) U.S. Cl.
CPC ...... *H01L 29/6625* (2013.01); *H01L 29/0808* (2013.01); *H01L 29/1008* (2013.01); *H01L 29/404* (2013.01); *H01L 29/735* (2013.01)

(58) Field of Classification Search
None
See application file for complete search history.

(56) References Cited

U.S. PATENT DOCUMENTS

| | | | |
|---|---|---|---|
| 4,967,253 A | 10/1990 | Jambotkar | |
| 6,242,313 B1 | 6/2001 | Hwang et al. | |
| 6,794,730 B2 | 9/2004 | Kim et al. | |
| 7,064,358 B2 | 6/2006 | Manna et al. | |
| 7,132,344 B1* | 11/2006 | Knorr | H01L 29/1004 257/197 |
| 8,067,953 B2 | 11/2011 | Lany et al. | |
| 8,258,602 B2 | 9/2012 | Ke et al. | |

(Continued)

*Primary Examiner* — Tom Thomas
*Assistant Examiner* — Steven B Gauthier
(74) *Attorney, Agent, or Firm* — McClure, Qualey & Rodack, LLP

(57) ABSTRACT

A manufacturing method of a semiconductor structure provides a substrate. A well having a first conductive type and a well having a second conductive type are formed in the substrate, respectively. A body region is formed in the well having the second conductive type. A first doped region and a second doped region are formed in the well having the first conductive type and the body region respectively. The first and second doped regions have same polarities, and a dopant concentration of the second doped region is higher than that of the first doped region. A third doped region is formed in the well having the second conductive type and between the first and second doped regions. The third and first doped regions have reverse polarities. A first field plate is formed on a surface region between the second and third doped regions.

14 Claims, 5 Drawing Sheets

(56) References Cited

U.S. PATENT DOCUMENTS

2004/0036145 A1    2/2004  Haynie
2010/0013458 A1*  1/2010  Lany ................. G01R 19/0092
                                                        324/123 R
2010/0187656 A1*  7/2010  Ke ......................... H01L 29/73
                                                        257/586

* cited by examiner

MANUFACTURING METHOD OF SEMICONDUCTOR STRUCTURE

The application is a divisional application of U.S. patent application Ser. No. 13/450,888 filed on Apr. 19, 2012, now U.S. Pat. No. 9,029,952, the subject matter of the application is incorporated herein by reference.

BACKGROUND OF THE INVENTION

Field of the Invention

The invention relates in general to a semiconductor structure and a manufacturing method thereof, and more particularly to a semiconductor structure related to a bipolar junction transistor (BJT) and a manufacturing method thereof.

Description of the Related Art

A bipolar junction transistor (BJT) is one of the most important semiconductor devices in modern times. The BJT is a three-terminal device that comprises two inseparable PN junctions. The terminals are called emitter, base, and collector. The BJT device conducts current with electrons and holes simultaneously and has the advantages of high speed and large current allowance in a small device, making the BiCMOS structure comprised of the BJT and CMOS devices popularly used to enhance operational speed of the transistor.

In design of the bipolar junction transistor, the dopant concentration of the emitter is increase to enhance the injection efficiency of the emitter. However, the breakdown voltage between the emitter and base is relatively decreased, thus causing the performance of the bipolar junction transistor worse.

SUMMARY OF THE INVENTION

The invention is directed to a semiconductor structure and a manufacturing method thereof, the current gain of a common-emitter circuit is improved and the breakdown voltage of a PN junction under reverse bias operation is enhanced.

According to a first aspect of the present invention, a semiconductor structure is disclosed. The semiconductor structure includes a substrate, a well having a first conductive type, a well having a second conductive type, a body region, a first doped region, a second doped region, a third doped region and a first field plate. The well having the first and second conductive type are respectively formed in the substrate. The body region is formed in the well having the second conductive type. The first doped region and the second doped region are respectively formed in the well having the first conductive type and the body region, wherein the second doped region and the first doped region has same polarities, and a dopant concentration of the second doped region is higher than a dopant concentration of the first doped region. The third doped region is formed in the well having the second conductive type, and located between the first doped region and the second doped region. The third doped region and the first doped region have reverse polarities. The first field plate is formed on a surface region between the second doped region and the third doped region.

According to a second aspect of the present invention, a semiconductor structure is disclosed. The semiconductor structure includes a substrate, a well having a first conductive type, a well having a second conductive type, a body region, a first doped region, a second doped region, a third doped region and a field plate. The well having the first and second conductive type are respectively formed in the substrate. The body region is formed in the well having the second conductive type. The first doped region and the second doped region are respectively formed in the well having the first conductive type and the body region, wherein the second doped region and the first doped region has same polarities, and a dopant concentration of the second doped region is higher than a dopant concentration of the first doped region. The third doped region is formed in the well having the second conductive type, and located between the first doped region and the second doped region. The third doped region and the first doped region have reverse polarities. The field plate is formed on a surface region between the first doped region and the third doped region, the field plate is made of poly silicon.

According to another aspect of the present invention, a manufacturing method of a semiconductor structure is disclosed. A substrate is provided. A well having a first conductive type and a well having a second conductive type are formed in the substrate, respectively. A body region is formed in the well having the second conductive type. A first doped region and a second doped region are formed in the well having the first conductive type and the body region respectively, wherein the second doped region and the first doped region has same polarities, and a dopant concentration of the second doped region is higher than a dopant concentration of the first doped region. A third doped region is formed in the well having the second conductive type and between the first doped region and the second doped region. The third doped region and the first doped region have reverse polarities. A first field plate is formed on a surface region between the second doped region and the third doped region.

According to another aspect of the present invention, a manufacturing method of a semiconductor structure is disclosed. A substrate is provided. A well having a first conductive type and a well having a second conductive type are formed in the substrate, respectively. A body region is formed in the well having the second conductive type. A first doped region and a second doped region are formed in the well having the first conductive type and the body region respectively, wherein the second doped region and the first doped region has same polarities, and a dopant concentration of the second doped region is higher than a dopant concentration of the first doped region. A third doped region is formed in the well having the second conductive type and between the first doped region and the second doped region. The third doped region and the first doped region have reverse polarities. A field plate is formed on a surface region between the first doped region and the third doped region, the field plate is made of poly silicon.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to a semiconductor structure and a manufacturing process thereof of the present invention, the field plate (a first field plate and/or a second field plate) covers a surface region between a p-type doped region and an n-type doped region, such as the surface region between the emitter doped region and the base doped region, the surface region between the base doped region and the collector doped region or both, to enhance the breakdown voltage of a junction between the emitter and the base, between the base and the collector or both under reverse bias operation. In addition, When the field plate is added, not only to increase the junction breakdown voltage, but also to prevent punch through effect due to the couple of the depletion regions of the emitter doped region and the collector doped region. Moreover, in order to increase the injection efficiency of the emitter, the emitter doped region having a higher dopant concentration is formed on the body region by means of ion implantation to lower the resistance of the emitter and make the carrier easy to flow between the emitter and the base, so that the current of the collector terminal is enlarged to enhance the current gain of a common-emitter amplified circuit.

A number of embodiments are disclosed below for detailed descriptions of the invention only, not for limiting the scope of protection of the invention.

First Embodiment

Figure 1:
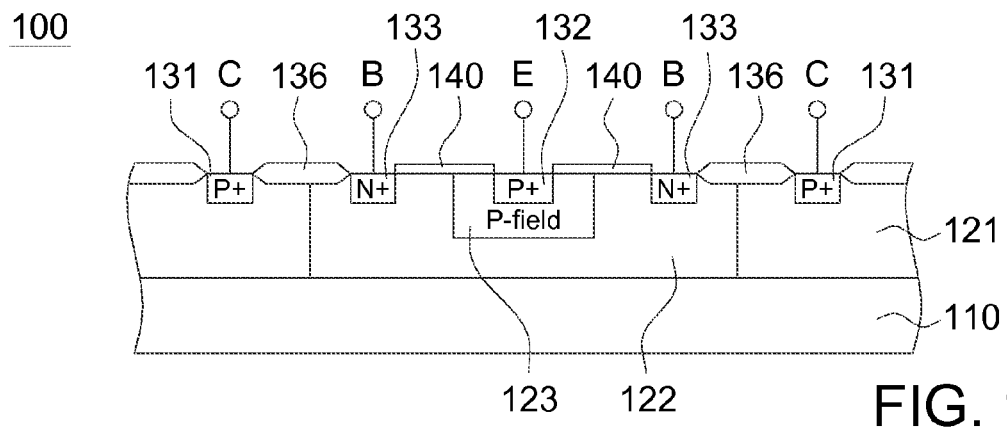
FIGS. 1-3 are schematic cross-sectional views illustrating three semiconductor structures according to an embodiment of the present invention.
Figure 2:
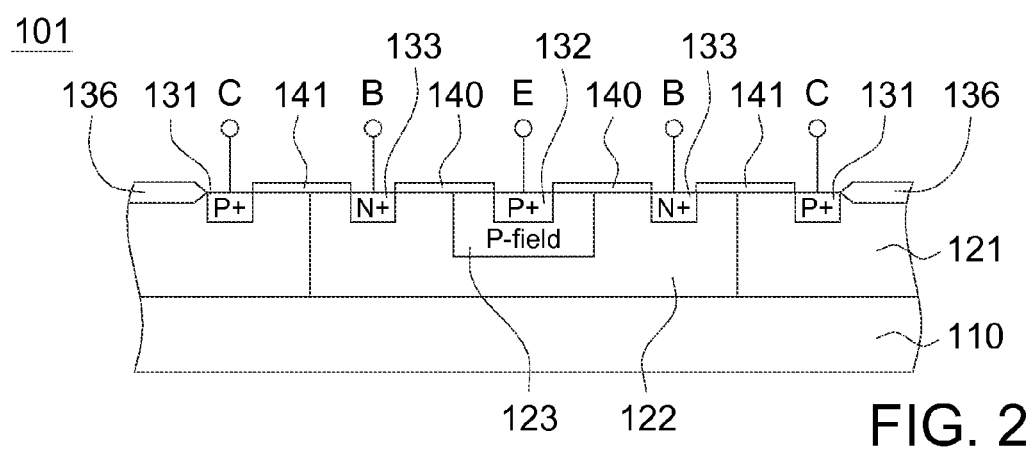
Figure 3:
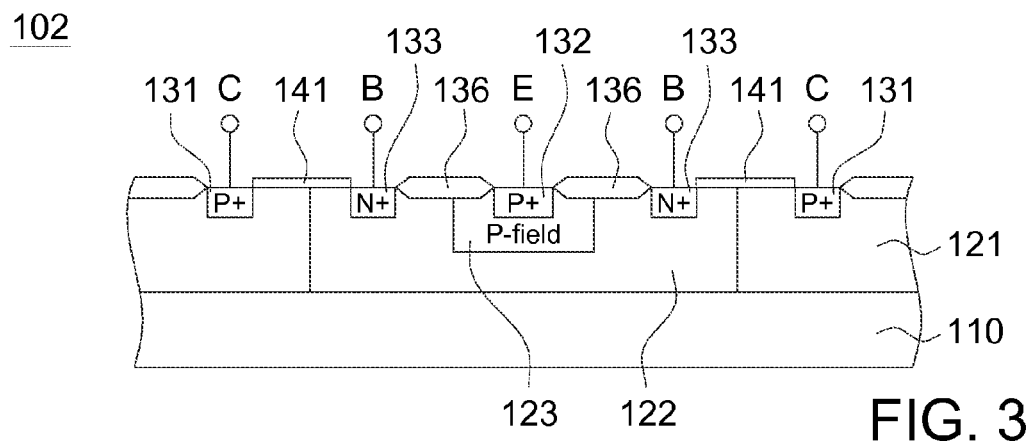

FIGS. 1-3 are schematic cross-sectional views illustrating three semiconductor structures according to an embodiment of the present invention. The semiconductor structure 100, such as a common-emitter bipolar junction transistor, includes a substrate 110, a well 121 having a first conductive type, a well 122 having a second conductive type, a body region 123, a first doped region 131, a second doped region 132, a third doped region 133 and a field plate 140. The substrate 110, for example, is a p-type silicon substrate, and the well 121 having the first conductive type and the well 122 having the second conductive type, for example, are p-type wells formed in the substrate 110 respectively. The first conductive type is such as p-type, and the second conductive type is such as n-type, but the present invention is not limited thereto, the first conductive type can be n-type and the second conductive type can be p-type.

The body region 123 is, such as a p-type doped region, formed on the well 122 having the second conductive type. The body region 123 has a p-type dopant concentration preferably higher than that of the well 121 having the first conductive type.

The first doped region 131 and the second doped region 132 are formed in the well 121 having the first conductive type (such as p-type) and the body region 123, to be used as a collector doped region and an emitter doped region. The second doped region 132 and the first doped region 131 have the same polarities, such as p-type dopant. However, the dopant concentration of the second doped region 132 is higher than that of the first doped region 131 because the p-type dopant concentration of the body region 123 is larger than the well 121 having the first conductive type. The second doped region 132 is, such as P+ doped region, used as a contact region of the emitter terminal E to lower the resistance of the second doped region 132.

In addition, the third doped region 133 is between the first doped region 131 and the second doped region 132, and formed on the surface region of the well 122 having the second conductive type (such as n-type) to be used as a base doped region. The third doped region 133 and the first doped region 131 have reverse polarities, such as n-type dopant and p-type dopant. As such, a transistor having a PNP junction is formed, but the present invention is not limited thereto, a transistor having a NPN junction can be formed.

Taken an example of a transistor having a PNP junction, when a forward bias is applied to the junction between the emitter terminal E and the base terminal B, and a reverse bias is applied to the junction between the collector terminal C and the base terminal B, a little carrier current injected into the base terminal B can enlarge the current of the collector terminal, and the ratio between the current (Ic) of the collector terminal C and the current (Ib) of the base terminal B ranges from 20-200, so that the current gain is achieved. In an embodiment, when the dopant concentration of the emitter doped region is increased, the resistance of the emitter doped region is decreased, and the current (Ic) of the collector terminal C can be enlarged under a smaller current (Ib) injected into the base terminal B, and thereby the current gain is enhanced accordingly.

Further, referring to FIG. 1, the field plate 140 is formed on a surface region between the second doped region 132 and the third doped region 133, and covers a portion surface region of the body region 123. The field plate 140 can directly cover the surface region of the well on which the field oxide 136 is not formed. In an embodiment, the field oxide 136, made of silicon oxide for example, is used to isolate the first doped region 131 (such as collector doped region) from the third doped region 133 (such as base doped region). The field plate 140 is made of poly silicon, for example. Since the field plate 140 can change the potential distribution between the second doped region 132 and the third doped region 133 to enlarge the range of a depletion region, the breakdown voltage (BVebo) of the junction between the emitter terminal E and the base terminal B can be enhanced under reverse bias operation. Furthermore, with the field plate 140, the punch through effect due to the couple of the depletion regions of the emitter doped region and the collector doped region can be prevented.

Next, referring to the semiconductor structure of FIG. 2, the field plate includes a first field plate 140 formed between the second doped region 132 and the third doped region 133 and a second field plate 141 between the first doped region 131 and the third doped region 133. As described above, the first field plate 140 can increase the breakdown voltage (BVebo) of the junction between the emitter terminal E and the base terminal B. Similarly, the second field plate 141 can increase the breakdown voltage (BVcbo) of the junction between the collector terminal C and the base terminal B. With the first field plate 140 and the second field plate 141, the punch through effect between the first doped region 131 and the second doped region 132 also can be prevented.

Referring to the semiconductor structure 102 of FIG. 3, the field plate 141 is only formed between the first doped region 131 and the third doped region 133, and the first field plate 140 previously formed between the second doped region 132 and the third doped region 133 is replaced by the field oxide 136. With the field plate 141, the breakdown voltage (BVcbo) of the junction between the collector terminal C and the base terminal B can be increased and the punch through effect between the first doped region 131 and the second doped region 132 also can be prevented.

Figure 4A:
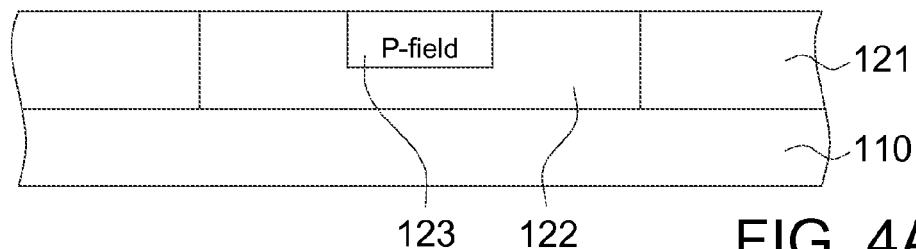
FIGS. 4A-4C show a manufacturing method of a semiconductor structure according to an embodiment of the present invention.
Figure 4B:
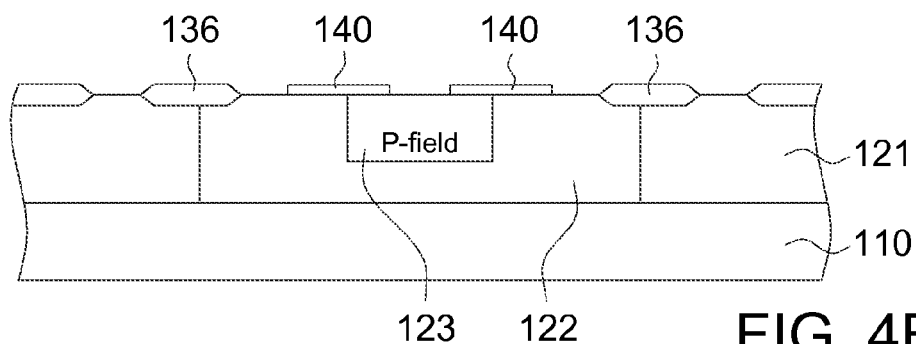
Figure 4C:
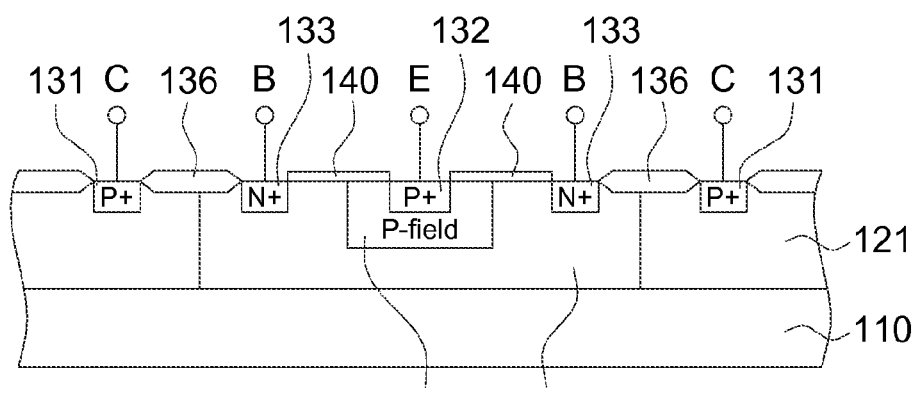

The manufacturing method of a semiconductor structure 100 is shown at below. Referring to FIG. 4A, a well 121 having a first conductive type and a well 122 having a second conductive type are formed in the substrate, respectively. Then, a body region 123 is formed in the well 122 having the second conductive type. The body region 123 has a first conductive type dopant concentration preferably higher than that of the well 121 having the first conductive type. Referring to FIG. 4B, a field oxide 136 is formed a portion of surface regions to separate devices and define the location and size of the first doped region 131. Then, a field plate 140 is formed on a portion of surface regions where the field oxide 136 is not formed to precisely define the location and size of the second doped region 132 and the third doped region 133. Referring to FIG. 4C, a doping process is performed to implant first conductive type dopants into the first doped region 131 and the second doped region 132, and implant second conductive type dopants into the third doped region 133. The first conductive type is such as p-type, and the second conductive type is such as n-type to form a transistor having a PNP junction, but the present invention is not limited thereto, the first conductive type can be n-type and the second conductive type can be p-type to form a transistor having a NPN junction.

Since the second doped region 132 is buried in the p-type body region 123, the dopant concentration of the second doped region 132 is relatively higher than that of the first doped region 131. In addition, the field plate 140 is between the second doped region 132 and the third doped region 133, and covers a portion surface region of the body region 123. However, the field plate can be formed between the first doped region 131 and the third doped region 133, such as the field plate 141 shown in the FIG. 2 and FIG. 3, which is not repeated herein.

Second Embodiment

Figure 5:
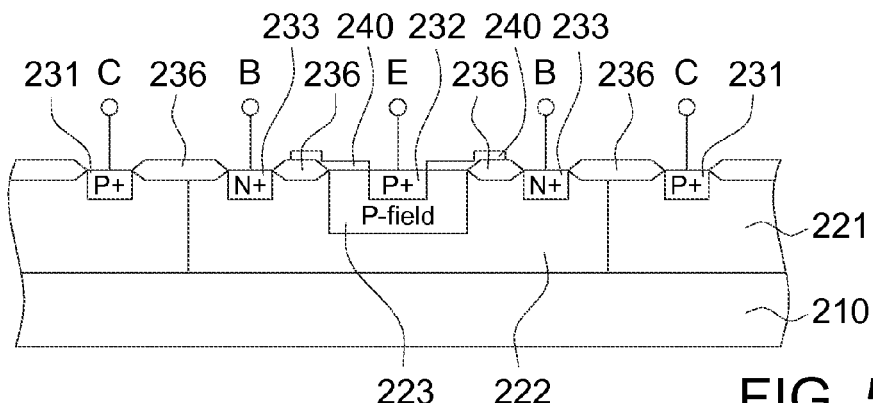
FIGS. 5-7 are schematic cross-sectional views illustrating three semiconductor structures according to an embodiment of the present invention.
Figure 6:
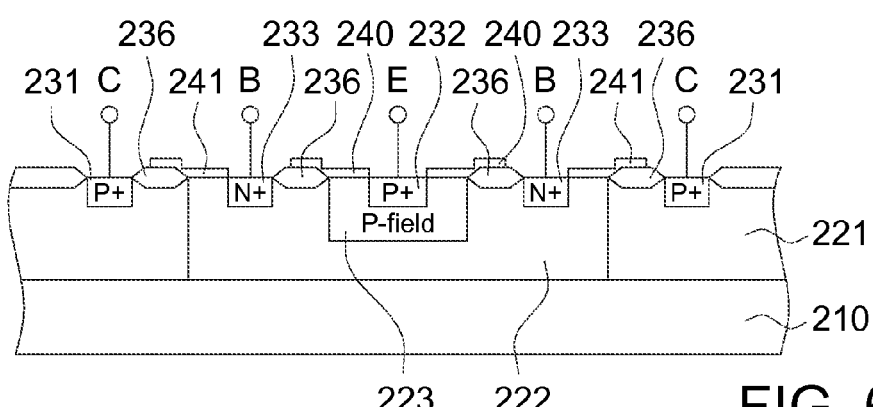
Figure 7:
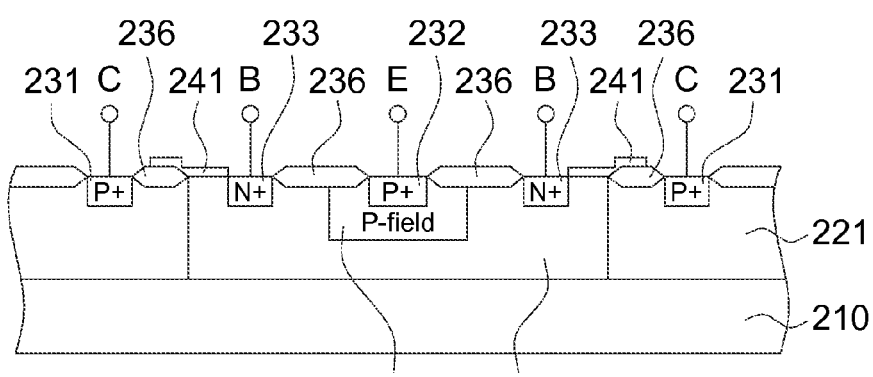

FIGS. 5-7 are schematic cross-sectional views illustrating three semiconductor structures according to an embodiment of the present invention. The semiconductor structure 200, such as a common-emitter bipolar junction transistor, includes a substrate 210, a well 221 having a first conductive type, a well 222 having a second conductive type, a body region 223, a first doped region 231, a second doped region 232, a third doped region 233, a field oxide 236 and a field plate 240. The present embodiment and the first embodiment are different in that: a field oxide 236 is formed firstly, and then a field plate 240 is formed to cover the field oxide 236. The field oxide 236 is used to separate devices and define the location and size of each doped region. The field oxide 236 is such as a local oxidation of silicon formed by thermal oxidation process or a shallow trench isolation (STI) formed by etching process. As compared to the first embodiment, since the field plate 240 is not directly covered the surface region of the well, the width dimension of the third doped region 233 is subjected to effect of dimension variant (beak portion) of the field oxide 236 and thus can not be controlled precisely. However, according to the first embodiment, if the field plate directly covers on the surface region of the well, the dimension of the doped region is not affected by the field oxide 236, so that the width dimension of the third doped region 233 (such as base doped region) can be controlled precisely to improve reliability.

Referring to FIG. 5, the field plate 240 is formed on a surface region between the second doped region 232 and the third doped region 233, and the field plate 240 can change the potential distribution between the second doped region 232 and the third doped region 233 to enlarge the range of a depletion region, so that the breakdown voltage (BVebo) of the junction between the emitter terminal E and the base terminal B can be enhanced under reverse bias operation. In addition, the first field plate 240 and the second field plate 241 shown in FIG. 6 and the field plate 241 shown in FIG. 7 are disposed in the same manner as shown in the first embodiment, which are not repeated herein.

Figure 8A:
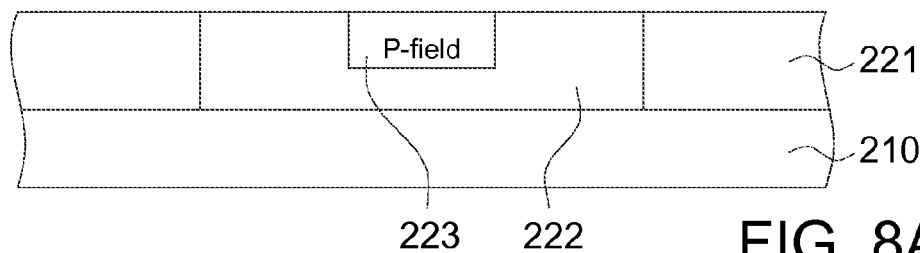
FIGS. 8A-8C show a manufacturing method of a semiconductor structure according to an embodiment of the present invention.
Figure 8B:
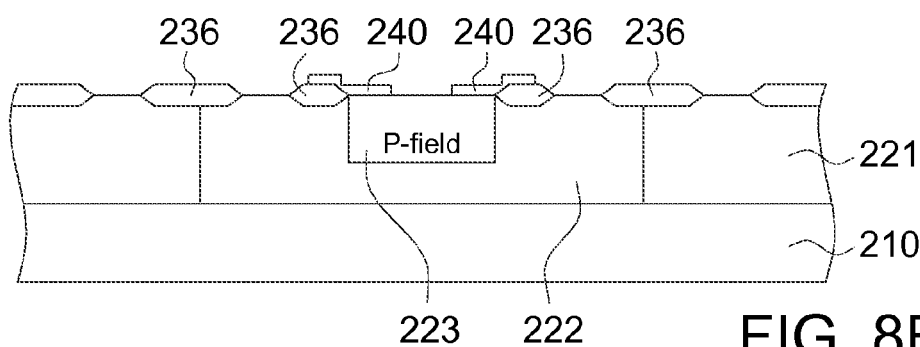
Figure 8C:
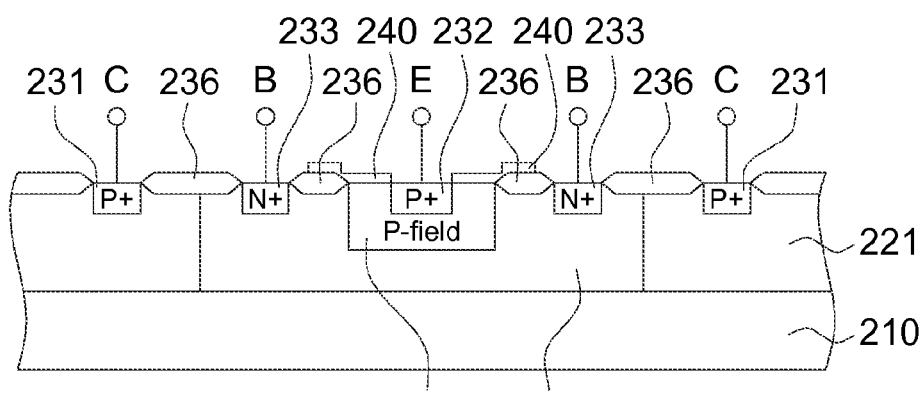

The manufacturing method of a semiconductor structure 200 has the same processes as shown in the FIGS. 4A-4C. Referring to FIG. 8A, a well 221 having a first conductive type and a well 222 having a second conductive type are formed in the substrate, respectively. Then, a body region 223 is formed in the well 222 having the second conductive type. The body region 223 has a first conductive type dopant concentration preferably higher than that of the well 221 having the first conductive type. Referring to FIG. 8B, a field oxide 236 is formed a portion of surface regions to separate devices and define the location and size of the first doped region 231 and the third doped region 233. Then, a field plate 240 is formed on the field oxide 236 and a portion surface region of the body region 223 to define the location and size of the second doped region 232. Referring to FIG. 8C, a doping process is performed to implant first conductive type dopants into the first doped region 231 and the second doped region 232, and implant second conductive type dopants into the third doped region 233. The first conductive type is such as p-type, and the second conductive type is such as n-type to form a transistor having a PNP junction, but the present invention is not limited thereto, the first conductive type can be n-type and the second conductive type can be p-type to form a transistor having a NPN junction.

Since the second doped region 232 is buried in the p-type body region 223, the dopant concentration of the second doped region 232 is relatively higher than that of the first doped region 231. In addition, the field plate 240 is between the second doped region 232 and the third doped region 233, and covers a portion surface region of the body region 223. However, the field plate can be formed between the first doped region 231 and the third doped region 233, such as the field plate 241 shown in the FIG. 6 and FIG. 7, which is not repeated herein.

The above-mentioned semiconductor structure 100 can be a metal oxidation semiconductor (MOS) device, such as vertical diffusion MOS, lateral double diffusion MOS (LDMOS) or enhanced diffusion MOS (EDMOS) device etc. However, the present invention is not limited thereto.

Figure 9:
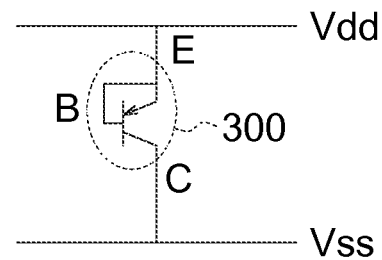
FIGS. 9 and 10 are schematic views illustrating two protection circuits according to an embodiment of the present invention.
Figure 10:
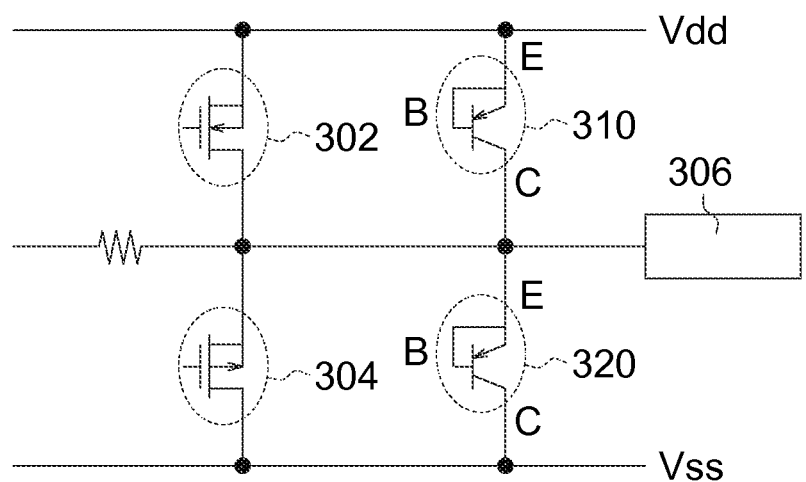

Referring to FIGS. 9 and 10, which are schematic views illustrating two protection circuits according to an embodiment of the present invention. In the FIG. 9, the bipolar junction transistor (BJT) 300 is connected to a high potential Vdd and a low potential Vss via the emitter E and the collector C respectively, and the emitter E and the base B of the BJT 300 are connected to each other. As described above, with the field plate, the BJT 300 has a high breakdown voltage so as to be an electrostatic discharge (ESD) protection circuit for power clamp. In addition, in the FIG. 10, two BJTs 310 and 320 are connected to a NMOS transistor and a PMOS transistor in parallel respectively, and the collector C of a BJT 310 and the emitter E of another BJT 320 are connected to an I/O pad 306. As described above, with the field plate, the two BJTs 310 and 320 have a high breakdown voltage so as to be an ESD protection circuit for I/O pad 306.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, the method comprising:
   providing a substrate;
   forming a well having a first conductive type and a well having a second conductive type in the substrate respectively;
   forming a body region in the well having the second conductive type;
   forming a first doped region and a second doped region in the well having the first conductive type and the body region respectively, wherein the second doped region and the first doped region has same polarities, and a dopant concentration of the second doped region is higher than a dopant concentration of the first doped region;
   forming a third doped region in the well having the second conductive type and between the first doped region and the second doped region, the third doped region and the first doped region have reverse polarities; and
   forming a first field plate on a surface region of the well having the second conductive type between the second doped region and the third doped region, and the first field plate laterally crossovers a portion of surface region of the body region and the surface region of the well having the second conductive type, and the body region is an emitter region having the first conductive type different from the second conductive type.

2. The method according to claim 1, further comprising forming a second field plate on a surface region between the first doped region and the third doped region.

3. The method according to claim 2, wherein the second field plate laterally crossovers a surface region of the well having the first conductive type and a surface region of the well having the second conductive type.

4. The method according to claim 2, wherein the second field plate is made of poly silicon.

5. The method according to claim 2, wherein before forming the second field plate, further comprising forming a field oxide on the surface region between the first doped region and the third doped region, and after forming the second field plate, the second field plate covers the field oxide.

6. The method according to claim 1, wherein before forming the first field plate, further comprising forming a field oxide on the surface region between the second doped region and the third doped region, and after forming the first field plate, the first field plate covers the field oxide.

7. The method according to claim 1, wherein the first field plate is made of poly silicon.

8. A manufacturing method of a semiconductor structure, the method comprising:
   providing a substrate;
   forming a well having a first conductive type and a well having a second conductive type in the substrate respectively;
   forming a body region in the well having the second conductive type;
   forming a first doped region and a second doped region in the well having the first conductive type and the body region respectively, wherein the second doped region and the first doped region has same polarities, and a dopant concentration of the second doped region is higher than a dopant concentration of the first doped region;
   forming a third doped region in the well having the second conductive type and between the first doped region and the second doped region, the third doped region and the first doped region have reverse polarities;
   forming a first field plate on a surface region of the well having the second conductive type between the second doped region and the third doped region, and a forward bias between the second doped region and the third doped region is controlled by the first field plate; wherein the first field plate laterally crossovers a portion of surface region of the body region and the surface region of the well having the second conductive type, and the body region is an emitter region having the first conductive type different from the second conductive type; and
   forming a second field plate on a surface region between the first doped region and the third doped region, and a reverse bias between the first doped region and the third doped region is controlled by the second field plate.

9. The method according to claim 8, wherein the second field plate laterally crossovers a surface region of the well having the first conductive type and a surface region of the well having the second conductive type.

10. The method according to claim 8, wherein the second field plate is made of poly silicon.

11. The method according to claim 8, wherein before forming the second field plate, further comprising forming a field oxide on the surface region between the first doped region and the third doped region, and after forming the second field plate, the second field plate covers the field oxide.

12. The method according to claim 8, wherein before forming the first field plate, further comprising forming a field oxide on the surface region between the second doped region and the third doped region, and after forming the first field plate, the first field plate covers the field oxide.

13. The method according to claim 8, wherein the first field plate is made of poly silicon.

14. The method according to claim 8, wherein the first doped region is a collector region having the first conductive type.

* * * * *